United States Patent [19]

Kabaya

[11] Patent Number: 4,499,374
[45] Date of Patent: Feb. 12, 1985

[54] PHOTOELECTRICAL ENCODER EMPLOYING AN OPTICAL GRATING

[75] Inventor: Yoshihiko Kabaya, Kanagawa, Japan
[73] Assignee: Mitutoyo Mfg. Co., Ltd., Tokyo, Japan
[21] Appl. No.: 380,818
[22] Filed: May 21, 1982

[30] Foreign Application Priority Data

Jun. 1, 1981 [JP] Japan ................................ 56-84084
Jun. 1, 1981 [JP] Japan ................................ 56-84082
Jun. 1, 1981 [JP] Japan ................................ 56-84083

[51] Int. Cl.$^3$ ........................ G01B 11/00; G08C 9/06
[52] U.S. Cl. ................................ 250/237 G; 356/395
[58] Field of Search .................... 250/237 G, 231 SE; 340/347 P; 356/395

[56] References Cited

U.S. PATENT DOCUMENTS 3,600,588   8/1971   Sayce .............................. 356/395 X

FOREIGN PATENT DOCUMENTS 1311275   3/1973   United Kingdom .

*Primary Examiner*—Edward P. Westin
*Attorney, Agent, or Firm*—Koda and Androlia

[57] ABSTRACT

A photoelectrical encoder wherein a physical quantity is detected from brightness obtained by moving a first and a second scales each provided thereon with an optical grating relative to each other, characterized in that the grating in one of the scales is constructed such that a first signal lead-out material layer made of a light shielding conductive material, a PN semiconductor layer for converting light into electricity and a second signal lead-out material layer made of a light transmitting conductive material are laminated on a light transmitting base member in the described order to form a narrow belt-shaped light receiving portion and a plurality of narrow belt-shaped light receiving portions thus formed are arranged at regular pitches, as against the light from the light transmitting base member, the light receiving portions function as light shielding slits and intervals between the light receiving portions are formed into light transmitting slits.

10 Claims, 4 Drawing Figures

PHOTOELECTRICAL ENCODER EMPLOYING AN OPTICAL GRATING

BACKGROUND OF THE INVENTION

1. Field of the Invention

The present invention relates to improvements in a photoelectrical encoder wherein a physical quantity is detected through brightness obtained by moving two optical gratings relative to each other.

2. Description of the Prior Art

The conventional photoelectrical encoders each have been of such an arrangement that rays are radiated from a light source to one of the optical gratings through a lens, and the rays, which have passed through the optical grating, further passes through the other of the optical gratings and reaches a receptor through a lens desposed on the other side.

In consequence, the rays from the light source are necessitated to pass through the two optical gratings, mixed with complex diffracted rays on the way, attenuated due to reflection and refraction of the surface of glass as being the base member of the optical grating, and further, absorption in the glass. As the result, signals obtained by a receptor, including noises, are necessitated to be weak. Further, the provisions of the light source, the lens and the receptor have necessarily resulted in a large-sized encoder.

There have also been the reflection type photoelectrical encoders in which the rays are caused to obliquely incide between the two optical gratings. The encoders of the type described are apt to a great loss in light quantity due to the diffraction, scattering, reflection and the like, the oblique mounting of the light source and the receptor have made it necessary to adopt construction of the encoder being complex and not satisfactorily compact.

In order to obviate the above-described disadvatages of the prior art, the present applicant has proposed the photoelectrical encoder wherein, in one of the optical gratings, a semiconductor base member is provided thereon at regular pitches with narrow belt-shaped conductive (contrary to the semiconductor base member) semiconductor layers, onto which the rays, which have transmitted through the other of the optical gratings are radiated, whereby outputs are obtained from the semiconductor base member and the semiconductor layers.

Such improvements for the compactness of the encoder and the working efficiency have been introduced in the above-described proposal that the lens on the side of the receptor being dispensed with, allowing the rays from the light source to pass through only one of the optical gratings and eliminating the space between the second optical gratings and the receptor.

As against the aforesaid proposal, there has further been proposed a photoelectrical encoder wherein, in order to obviate or decrease the resistance of slits for the improvements in the high-frequency characteristics of the outputs from slit-shaped light receiving elements consisting of the semiconductor base member and the semiconductor layers, the whole surfaces of the light receiving elements are coated with a transparent conductive material to put together the outputs.

There has still further been proposed a photoelectrical encoder wherein a continually flat semiconductor layer is provided thereon with slits having an opaque film, whereby the high-frequency characteristics is improved and the production is facilitated.

There has yet further been proposed a photoelectrical encoder wherein the semiconductor base member and the semiconductor layer are made of MOS semiconductor and the slits having the opaque film are made of a metal portion in the MOS semiconductor.

Notwithstanding, scales of the aforesaid photoelectrical encoders are not satisfactorily rendered compact, and, in the case of the scale made of MOS semiconductor for example, a silicon crystal used as the material is high in cost and cannot formed into an elongate form, thus presenting difficult problems from the economic and technical viewpoints. This is especially true of the case of applying the same to the main scale.

In general, the reflection type photoelectrical encoder is more compact in construction than the transmitting type photoelectrical encoder. In the case of the reflection type encoder, the rays for being radiated onto a relection scale must be caused to obliquely incide. Because of this, there are presented such disadvantages that the loss in light due to the diffraction, scattering, reflection and the like is great, a light emitting portion and light receiving portions are obliquely mounted, thus resulting in complicated construction.

SUMMARY OF THE INVENTION

It is therefore the primary object of the present invention to provide a photoelectrical encoder further rendered compact and having a decreased number of parts.

It is an another object of the present invention to provide a photoelectrical encoder being easy in production even in the elongate form and low in cost.

It is a further object of the present invention to provide a photoelectrical encoder rendered compact and improved in the high-frequency characteristics.

It is a still further object of the present invention to provide a photoelectrical encoder rendered thin in construction and having reduced troubles and errors caused by the vibrations.

It is a yet further object of the present invention to provide a reflection type photoelectrical encoder being low in loss of light and free from an obliquely mounted light source.

To achieve one of the above-described objects, the present invention contemplates that, in a photoelectrical encoder wherein a physical quantity is detected from brightness obtained by moving a first and a second scales each provided thereon with an optical grating relative to each other, the grating in one of said scales is constructed such that a first signal lead-out material layer made of a light shielding conductive material, a PN semiconductor layer for converting light into electricity and a second signal lead-out material layer made of a light transmitting conductive material are laminated on a light transmitting base member in the described order to form a narrow belt-shaped light receiving portion and a plurality of narrow belt-shaped light receiving portions thus formed are arranged at regular pitches, as against the light from said light transmitting base member, said light receiving portions function as light shielding slits and intervals between the light receiving portions are formed into light transmitting slits.

To achieve one of the above-described objects, the present invention contemplates that, in the photoelectrical encoder having the above-described construction, the height of said light receiving portion from the surface of said light transmitting base member is made to be one half or less of the width of said light transmitting slit.

To achieve one of the above-described objects, the present invention contemplates that, in a photoelectrical encoder having the above-described construction, said PN semiconductor layer is made of amorphous semiconductor.

To achieve one of the above-described objects, the present invention contemplates that, in a photoelectrical encoder having the above-described construction, said semiconductor layer is of P-i-N structure.

To achieve one of the above-described objects, the present invention contemplates that, in a photoelectrical encoder wherein a physical quantity is detected from brightness obtained by moving a first and a second scales each provided thereon with an optical grating relative to each other, said first scale is constructed such that narrow belt-shaped reflecting portions and unreflecting portions are alternatley arranged on a base member, said second scale is constructed such that, on a light transmitting base member, a first signal lead-out material layer made of a light shielding conductive material, a PN semiconductor layer for converting light into electricity and a second signal lead-out material layer made of a light transmitting conductive material are laminated in the described order to form a narrow belt-shaped light receiving portion and a plurality of narrow belt-shaped light receiving portions thus formed are arranged at regular pitches, as against the light from said light transmitting base member, said light receiving portions function as light shielding slits and intervals between the light receiving portions are formed into light transmitting slits, said first and the second scales are disposed in such a manner that said light reflecting portion and said light receiving portion face each other, and the light from said light source is adapted to be transmitted through said light transmitting slits of said second scale and radiated onto said reflecting portions of said first scale.

To achieve one of the above-described objects, the present invention contemplates that, in the photoelectrical encoder having the above-described construction, said second scale is made movable relative to said first scale.

To achieve one of the above-described objects, the present invention contemplates that, in a photoelectrical encoder wherein a physical quantity is detected through brightness obtained by moving a first and a second scales each provided thereon with an optical grating relative to each other, the first scale is constructed such that narrow belt-shaped reflecting portions and unreflecting portions are alternately arranged on a base member, the second scale is constructed such that, on a light transmitting base member, a first signal lead-out material layer made of a light shielding conductive material, a PN semiconductor layer for converting light into electricity and a second signal lead-out material layer made of a light transmitting conductive material are laminated in the described order to form a narrow belt-shaped light receiving portion and a plurality of narrow belt-shaped light receiving portions thus formed are arranged at regular pitches, as against the light from the aforesaid light transmitting base member, the light receiving portions function as light shielding slits and intervals between the light receiving portions are formed into light transmitting slits, a light source is disposed through the light transmitting material on the side opposite the light receiving portions and a reflector is provided for reflecting the light from this light source and radiating the light through the light transmitting base member to the side opposite the light source, the first and the second scales are disposed in such a manner that the light reflecting portion and the light receiving portions face each other, and the light from the light source is adapted to be transmitted through the light transmitting slits of the second scale and radiated onto the relecting portions of the first scale.

To achieve one of the above-described objects, the present invention contemplates that, in the aforesaid photoelectrical encoder, the reflector is made to be a concave mirror disposed in the rear of the light source.

To achieve one of the above-described objects, the present invention contemplates that, in the aforesaid photoelectrical encoder, a substance for improving a refractive index is interposed between the light transmitting base member of the second scale, the light source and the reflector.

To achieve one of the above-described objects, the present invention contemplates that, in the aforesaid photoelectrical encoder, the light source is coated with a light transmitting solid material and a light reflecting film is formed on the outer periphery of the light transmitting solid material.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DETAILED DESCRIPTION OF THE INVENTION EMBODIMENT

Figure 1:
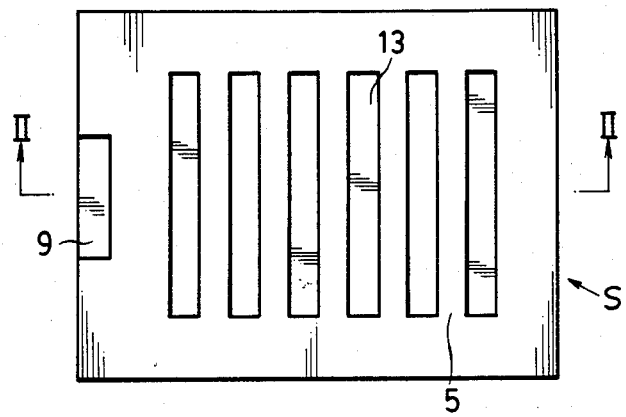
FIG. 1 is a plan view showing the scale in an embodiment of the photoelectical encoder according to the present invention.
Figure 2:
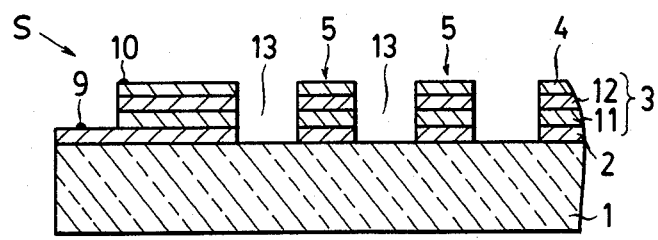
FIG. 2 is an enlarged sectional view taken along the line II—II in FIG. 1.

Description will hereunder be given of an embodiment of the present invention with reference to the accompanying drawings.

The scale S in this embodiment is constructed such that, for example, on a light transmitting base member 1, a first signal lead-out material layer 2 made of a light shielding conductive material, e.g., a metal film, a PN semiconductor layer 3 for converting the light into electric signals, and a second signal lead-out material layer 4 formed of a transparent film made of light transmitting conductive materials, e.g., $In_2O_3$, $SnO_2$, Si or a mixture of these materials are laminated in the described order to be formed into a light receiving portion 5 and a plurality of light receiving portions 5 thus formed are arranged at regular pitches.

Figure 3:
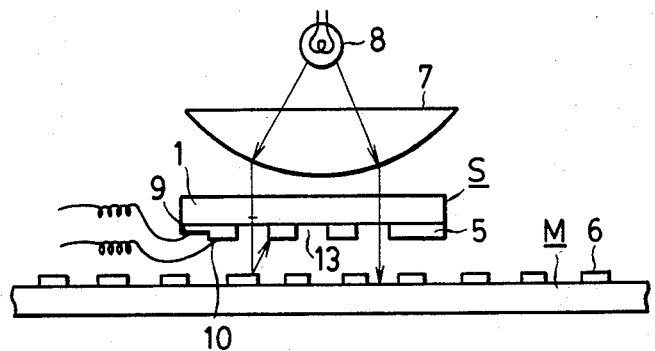
FIG. 3 is a schematic side view showing the principle use of the photoelectrical encoder in the aforesaid embodiment.

As shown in FIG. 3, the scale 5, the second scale, is disposed in such a manner that the light receiving portions 5 thereof face the reflecting portions 6 of the reflection type main scale M, and used in such a manner that the light from a light source 8 is caused to incide to a reflection type main scale M from the rear of the scale S through a lens 7.

Spaces formed between the respective light reflecting portions 6 of the main scale M are formed into non-reflecting portions consisting of light transmitting or light absorbing portions.

More specifically, the second signal lead-out material layers 4 of the light receiving portions 5 function to shield the rays from the light source 8, whereby the light receiving portions 5 serves as light shielding slits and spaces formed between the respective light receiving portions 5 function as light transmitting slits, so that the rays from the light source 8 can be radiated onto the reflection type main scale M through the light transmitting base member 1.

The rays reflected by reflecting portions 6 of the reflection type main scale M pass through the second signal lead-out material layers 4 of the light receiving portions 5, and reach PN semiconductor layers 3, where the rays are converted into electric outputs in the semiconductors. The electric outputs in the semiconductor layers 3 are taken to outside through the output terminals 9 and 10.

In other words, the scale S is adapted to functions as an index sensor in which an index scale and light receiving elements are integrated.

Description will hereunder be given of method of producing the aforesaid scale S.

Firstly, a glass base plate as being the light transmitting base member 1 is fastened in a vacuum metallizing apparatus, heated to a temperature ranging from 150° to 200° C. under a degree of vacuum of $5 \times 10^{-6}$ torr, and Cr is evaporated from a tungsten board, whereby a Cr film having a thickness of 2,000 to 3,000Å as being the first signal lead-out material layer 2 is formed on the glass base plate by deposition.

Subsequently, the glass base plate thus formed thereon with the Cr film is heated to a temperature of 300° C. in a plasma chamber, and Ar gas containing therein 10% of $SiH_4$ is diluted to 10 times by $H_2$ gas and introduced into the plasma chamber, where a N type amorphous silicone (N-a-Si) film 11 and a P type amorphous silicone (P-a-Si) film 12 are laminated on the aforesaid first signal lead-out material layer 2 by high-frequency glow discharage under a pressure of 0.1-2 torr, whereby a PN semiconductor layer 3 having a thickness of approx. 1 micron is formed.

The N type amorphous slicon film 11 is separated out by mixing a very small amount of $PH_3$ into a reacting gas at the initial stage of separation, and the P type amorphous silicone film 12 is separated out by changing $PH_3$ over to $B_2H_6$ on the way of reaction, respectively. Here, the PN semiconductor 3 may be formed by thermal decomposition method, sputter deposition method or the like.

Subsequently, the base member 1 thus formed thereon with the PN semiconductor layer 3 is place in a vacuum deposition tank heated to a temperature of 150° C., and $In_2O_3$ contained in an alumina pot is deposited on the base member 1 by elecronic beam deposition method to form an $In_2O_3$ film having a thickness of 1,000Å, whereby a second signal lead-out material layer 4 is formed on the aforesaid PN semiconductor layer 3.

Next, photoresist is coated on the second signal lead-out material layer 4 as thick as about 2 microns by spin coating method and dried. Further, an output terminal portion 9 is shielded from the light by use of a mask, thereafter, exposed to ultra-violet rays and developed, and photoresist on the output terminal portion 9 is removed.

Subsequently, the second signal lead-out material layer 4 and the PN semiconductor layer 3 are removed from the output terminal portion 9 by chemical etching method, plasma etching method or the like, to thereby expose the first signal lead-out material layer 2.

Likewise, portions other than the light transmitting slits 13 portions between the light receiving portions 5 are coated with photoresist and the first and second signal lead-out material layers 2, 4 and the PN semiconductor layer 3 corresponding in position to the light transmitting slits 13 are removed by plasma etching method or the like, to thereby expose the light transmitting base member 1.

Here, if the width of the light transmitting slit 13 is made to be more than twice the height of the light receiving portion 5 from the surface of the light transmitting base member 1, then it is convenient for detecting the brightness.

Subsequently, lead wires for taking electric current out of the first and second signal lead-out material layer 2 and 4 are secured to the aforesaid output terminals 9 and 10 by use of a conductive adhesive, and finally, a silicone varnish is thinly applied to all over the PN semiconductor layer for the protection thereof and dried, thus completing the encoder.

Further, in the above-described embodiment, the rays from the light source 8 is caused to vertically incide into the scale S through the lens 9, however, the light source may be obliquely provided so far as the rays are radiated onto the main scale M through the scale S.

In this case, the advantage that the scale is reduced in size in the widthwise direction thereof can be offered.

Figure 4:
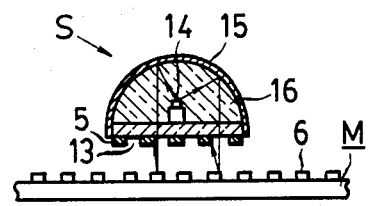
FIG. 4 is a schematic side view showing another embodiment of the present invention.

Description will hereunder be given of another embodiment of the present invention with reference to FIG. 4.

Here, same reference numerals as shown in the above-described first embodiment are used to designate same or similar parts, so that description thereof will be omitted.

This embodiment is of such an arrangement that the scale S is provided with a light source 14 on the side opposite the light receiving portions 5 through the light transmitting base member 1 and a reflector 15 whereby the light from the light source 14 is radiated to the other side through the light transmitting base member 1.

The reflector 15 is formed such that a light reflecting film formed of a deposited metal film or the like is provided on the outer periphery of a substantially semi-spherical transparent resin 16 integrally formed on the light transmitting base member 1 on the side of the light source 14.

The transparent resin 16 is made of a light transmitting material equal in refractive index to that of the light transmitting base member 1 and extends around the light source.

The present embodiment is advantageous in that a mere provision of two scales can constitute an encoder because the light source 14 is mounted on the index scale S itself and both members are integrally molded by the transparent resin 16, and also advantageous in that troubles and errors, which would otherwise be caused by vibrations, can be obviated because the light source and the index scale S are integrally formed.

It should be apparent of those skilled in the art that the abovedescribed embodiments are merely representative, which represent the applications of the principles of the present invention. Numerous and varied other arrangements can be readily devised by those skilled in the art without departing from the spirit and the scope of the invention.

What is claimed is:

1. A photoelectrical encoder employing optical gratings wherein a physical quantity is detected from brightness obtained by moving a first and a second scale each provided thereon with an optical grating relative to each other, characterized in that said first scale is constructed such that narrow belt-shaped reflecting portions and unreflecting portions are alternately arranged on a base member, said second scale is constructed such that, on a light transmitting base member, a first signal lead-out material layer made of a light shielding conductive material, a PN semiconductor layer for converting light into electricity and a second signal lead-out material layer made of a light transmitting conductive material are laminated in the described order to form a narrow belt-shaped light receiving portion and a plurality of narrow belt-shaped light receiving portions thus formed are arranged at regular pitches, as against the light from said light transmitting base member, said light receiving portions function as light shielding slits and intervals between the light receiving portions are formed into light transmitting slits, a light source is fixed to the light transmitting base member on the side opposite said light receiving portions and a reflector is fixed to the light transmitting base member for reflecting the light from said light source and radiating the light through the light transmitting base member to the side opposite the light source, said first and second scales are disposed in such a manner that said light reflecting portions and said light receiving portions face each other, and the light from said light source is adapted to be transmitted through said light transmitting slits of said second scale and radiated onto reflecting portions of said first scale.

2. A photoelectrical encoder employing optical gratings as set forth in claim 1, characterized in that a light transmitting material fills the space between said light transmitting base member of said second scale, said light source and said reflector.

3. A photoelectrical encoder employing optical gratings as set forth in claim 2, characterized in that said light transmitting material is equal in refractive index to that of said light transmitting base member and extends around the light source.

4. A photoelectrical encoder employing optical gratings as set forth in claim 1, characterized in that said reflector is formed such that a light reflecting film formed of a deposited metal film is provided on the outer periphery of a light transmitting material surrounding said light source and integrally formed on the light transmitting base member on the side of the light source.

5. A photoelectrical encoder employing optical gratings as set forth in claim 2, characterized in that said reflector is formed such that a light reflecting film formed of a deposited metal film is provided on the outer periphery of said light transmitting material surrounding said light source and integrally formed on the light transmitting base member on the side of the light source.

6. A photoelectrical encoder employing optical gratings as set forth in claim 3, characterized in that said reflector is formed such that a light reflecting film formed of a deposited metal film is provided on the outer periphery of said light transmitting material surrounding said light source and integrally formed on the light transmitting base member on the side of the light source.

7. A photoelectrical encoder employing optical gratings as set forth in claim 4, characterized in that said light transmitting material is substantially semispherical.

8. A photoelectrical encoder employing optical gratings as set forth in claim 5, characterized in that said light transmitting material is substantially semispherical.

9. A photoelectrical encoder employing optical gratings as set forth in claim 6, characterized in that said light transmitting material is substantially semispherical.

10. A photoelectrical encoder employing optical gratings as set forth in claim 1, characterized in that said light source is coated with a light transmitting solid material and a light reflecting film is formed in the outer periphery of said light transmitting solid material to form said reflector.

* * * * *